United States Patent [19]

Simpson

[11] Patent Number: 4,902,917

[45] Date of Patent: Feb. 20, 1990

[54] INTEGRATED CIRCUIT HAVING MODE SELECTION

[75] Inventor: Richard Simpson, Bedford, England

[73] Assignee: Texas Instruments Incorporated, Dallas, Tex.

[21] Appl. No.: 294,039

[22] Filed: Jan. 5, 1989

[51] Int. Cl.$^4$ ............... H03K 19/173; H03K 19/017; G11C 7/02

[52] U.S. Cl. .................................. 307/465; 307/448; 307/468; 365/189.03

[58] Field of Search ............... 307/448, 443, 451, 465, 307/468, 303.1; 365/238.5, 225.7, 189.03

[56] References Cited

U.S. PATENT DOCUMENTS 4,727,514  2/1988  Bhuva et al. .................. 365/189.03

Primary Examiner—Stanley D. Miller
Assistant Examiner—Margaret Rose Wambach
Attorney, Agent, or Firm—William E. Hiller; N. Rhys Merrett; Mel Sharp

[57] ABSTRACT

The mode of operation of an intergrated circuit capable of several modes of operation is determined by at least one signal applied to one or more mode selection terminal pins. The signal applied is a selected one of at least two signals derived from a clock signal used by the integrated circuit in its operation. The clock signal is generated by an oscillator which may be included in the integrated circuit or external to it; in either case, the clock signal appears at another terminal pin of the integrated circuit.

8 Claims, 2 Drawing Sheets

INTEGRATED CIRCUIT HAVING MODE SELECTION

This invention relates to integrated circuits.

Electronic circuits of ever greater complexity are being asked for and in many cases they have to be of the smallest physical size possible. These requirements have led to the development of VLSI integrated circuits and many applications need several such integrated circuits on a small circuit board. A difficulty in the manufacture of complex integrated circuits is that quite a large number of input and output connections have to be provided to a circuit with the result that the size of the package containing the semiconductor chip in which the circuit is formed bears no relationship to the size of the chip itself but is dependent solely on the number of terminal pins needed for the input and output connections. It is therefore desirable to keep to a minimum the number of the input and output connections of the circuit. By keeping down the number of pins not only is the size of the package kept down but so also is the cost. Moreover, the fewer connections there are the less there is to go wrong and consequently the reliability of the circuit is enhanced by keeping down the number of connections.

Certain complex integrated circuits have several modes of operation. In order to select the operation mode one or more special pins of the circuit are selectively connected to either ground or the positive supply voltage (Vcc). Each special pin provided for this purpose doubles the number of modes that can be selected. If the number of modes is between 9 and 16, four special pins are needed. Even more modes of operation may be offered by very complex integrated circuits so that more pins are required to be dedicated to mode selection.

It is an object of the present invention to enable the mode selection to be carried out with fewer pins dedicated to that selection.

According to the present invention there is provided an integrated circuit having at least two different modes of operation selected by a mode selection circuit in response to one or more inputs applied to one or more mode selection terminal pins, respectively, and one or more other terminal pins for one or more clock signals from a clock means, respectively, wherein at least one mode selection terminal pin is connected to a synchronous decoding circuit responsive to a clock signal related to that applied to the other terminal pin or one of the other terminal pins by the clock means and capable of producing a particular output only when another signal related to the clock signal applied to the said other terminal pin by the clock means is applied to the mode selection terminal pin or at least one of the mode selection terminal pins, the mode selection circuit being responsive to the particular output of the synchronous decoding circuit.

The clock means may be included in the integrated circuit whereby the at least one other terminal pin conveys one or more signals from the clock means as an output from the integrated circuit. Alternatively, the clock means may be external to the integrated circuit and each signal from the clock means is applied to the integrated circuit through the at least one other terminal pin.

The synchronous decoding circuit may include two or more synchronous decoders respectively responsive to different phases and/or frequencies of clock signals from the clock means.

According to the present invention there is also provided a circuit arrangement including an integrated circuit having at least two different modes of operation selected by a mode selection circuit in response to one or more inputs applied to one or more mode selection terminal pins respectively and one or more other terminal pins for receiving respective clock signals, clock means connected to apply clock signals to the one or more other terminal pins, and mode selecting means connected to the one or more mode selection terminal pins, wherein, in the integrated circuit, at least one mode selection terminal pin is connected to a synchronous decoding circuit responsive to the input or inputs received via the at least one mode selection terminal pin using as a reference at least one clock signal derived from those applied to the one or more other terminal pins, the mode selection circuit being responsive to one or more outputs from the synchronous decoding circuit, and the mode selecting means is capable of applying to the at least one mode selection terminal pin a clock signal derived from the clock means so as to cause the mode selection circuit to select a particular mode of operation of the integrated circuit.

In an example of the invention the synchronous decoding circuit is connected to a single other terminal pin and is capable of producing four different outputs depending on the voltage applied to the single terminal pin, the first in response to a sustained high voltage level, the second in response to a sustained low voltage level, the third in response to a first phase of a signal derived from the clock means, and the fourth in response to a second phase of the signal derived from the clock means.

Examples of the invention will now be described with reference to the accompanying drawings, of which:

Figure 3:
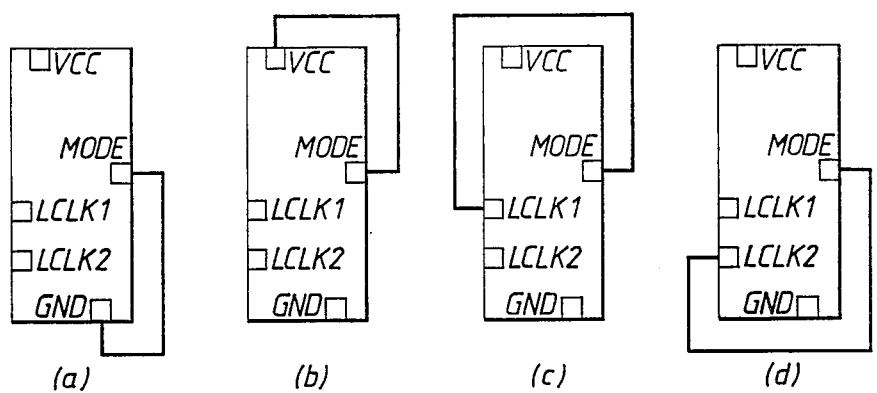
Figure 4:
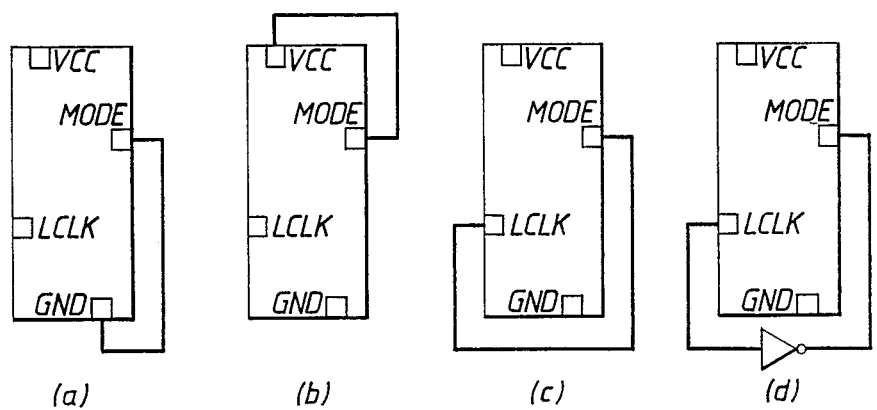

FIGS. 3(a), (b), (c) and (d) show the different external circuit connections for selecting the different modes of an integrated circuit according to one example of the invention; and FIGS. 4(a), (b), (c) and (d) show the different external circuit connections for selecting the different modes of an integrated circuit according to another example of the invention.

One example of an integrated circuit according to the invention to be described with reference to the drawings is a microprocessor and it has four different modes of operation which respectively relate to the different sizes of dynamic RAM chips which can be used with it. The row and column addresses of 64K, 256K, 1M and 4M bit DRAM chips contain 8, 9, 10 and 11 bits respectively, and the addressing circuits of the microprocessor must be adjusted accordingly if proper use is to be made of the data storage capacity of the chips.

Figure 1:
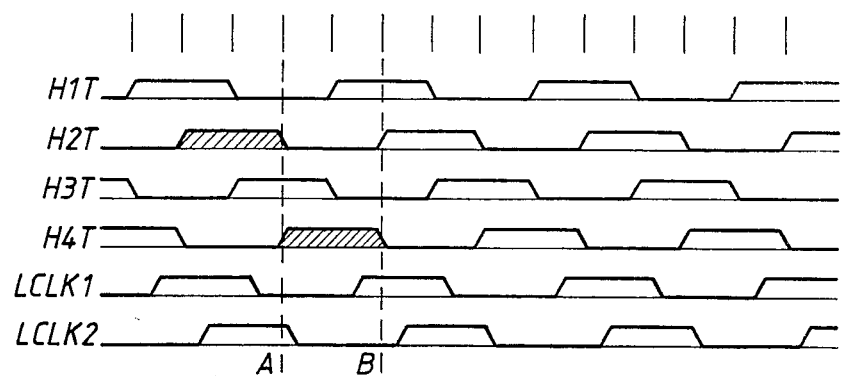
FIG. 1 shows the waveforms of clock signals in one example of the invention.

Four clock signals are used in the microprocessor, these being derived from an internal clock. The clock signals are all square waves of the same pulse repetition frequency and are progressively shifted in phase by a time period equal to half the pulse duration. The waveforms of the four signals are shown in FIG. 1 as H1T, H2T, H3T and H4T, respectively.

For timing operations in external circuits connected to the microprocessor it produces two local clock signals, LCLK1 and LCLK2, as outputs. The two local clock signals are also shown in FIG. 1 from which it can be seen that they are respectively derived from the internal clock signals H1T and H2T, but are slightly delayed relative to them. The difference in the pulse timings arising from the delay is used in the synchronous decoding circuit shown in FIG. 2. It would be possible for the local clock signals as output by the microprocessor to be synchronous with the internal clock signals H1T and H2T, provided that sufficient delay resulted in the propagation of the local clock signals through the circuits external to the microprocessor.

The microprocessor has a single mode pin to which four different signals are applied in order to select the four different modes of operation. The four different signals are:
1. a steady level of 0 volts, i.e. ground.
2. a steady level of the supply voltage Vcc.
3. the local clock signal LCLK 1.
4. the local clock signal LCLK 2.

Figure 2:
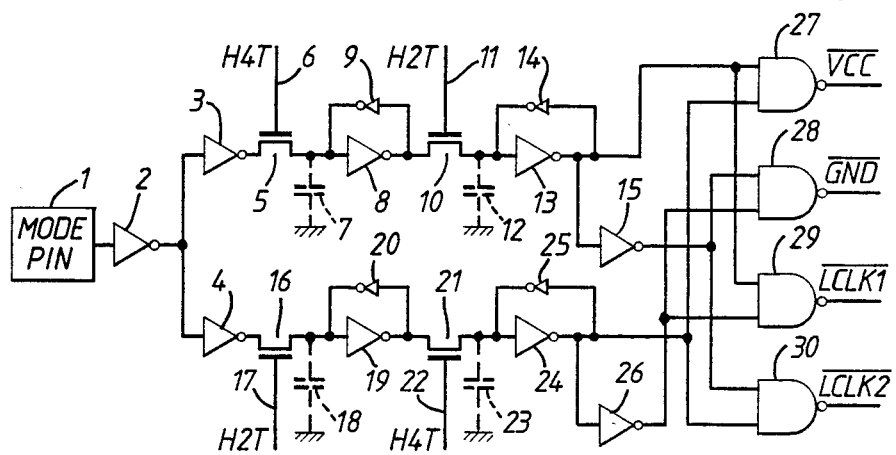
FIG. 2 is the circuit diagram of one example of a synchronous decoding circuit.

FIG. 2 shows the circuit diagram of the synchronous decoding circuit in the microprocessor connected to the mode pin for the purpose of discriminating between the four different signals which could be applied to it. In FIG. 2, the mode pin 1 is connected by an inverter 2 acting as a buffer amplifier to the inputs of two inverters 3 and 4. The output of the inverter 3 is connected through a MOSFET 5, controlled by the clock signal H4T applied via a conductor 6 to its gate, to the input of an inverter 8. A low-gain inverter 9 is connected from the output to the input of the inverter 8 to produce a triggering effect, raising a high voltage level and lowering a low voltage level, at the input of the inverter 8. The voltage level at the input of the inverter 8 is stored on the capacitance of the wiring and input capacitance of the inverter 8. This capacitance is represented by the capacitor 7 shown dotted in the figure. The output of the inverter 8 is connected through a MOSFET 10, controlled by the clock signal H2T applied via a conductor 11 to its gate, to the input of an inverter 13. A low-gain inverter 14 is connected from the output to the input of the inverter 13 in the same way and for the same reason as the inverter 9 is connected to the inverter 8. The output of the inverter 13 is connected to an inverter 15. The capacitance of the wiring and the input capacitance of the inverter 13 is represented by the capacitor 12.

The output of the inverter 4 is connected to a circuit comprising components 16 to 26 similar to that connected to the output of the inverter 3 as described above and comprising components 5 to 15. The difference between the two circuits is that, whereas the MOSFETs 5 and 10 of the circuit connected to the output of the inverter 3 are respectively controlled by the clock signals H4T and H2T, the MOSFETs 16 and 21 of the circuit connected to the output of the inverter 4 are respectively controlled by the clock signals H2T and H4T.

Four two-input NAND gates 27, 28, 29 and 30, each have one input connected to the output of the inverter 13, either directly or through the inverter 15, and one input connected to the output of the inverter 24, either directly or through the inverter 26. The gate 27 receives the outputs of the inverters 13 and 24 directly. The gate 28 receives the outputs of the inverters 13 and 24 inverted. The gate 29 receives the output of the inverter directly and the output of the inverter 24 inverted. The gate 30 receives the output of the inverter 13 inverted and the output of the inverter 24 directly.

The circuit shown in FIG. 2 responds to whichever of the four different signals listed above is applied to the mode pin 1 and causes the output voltage of a corresponding one of the NAND gates 27, 28, 29 and 30 to go low. Thus, if the supply voltage Vcc is applied to the mode pin 1, the output of the gate 27 goes low. If the mode pin 1 is connected to the ground the output of the gate 28 goes low. If the local clock signal LCLK 1 is applied to the mode pin 1 it is the output of the gate 29 that goes low. Finally, the local clock signal LCLK 2 applied to the mode pin 1 causes the output of the gate 30 to go low.

In the operation of the circuit of FIG. 2 the MOSFETs 5 and 16 act as switches controlled by the signals H4T and H2T respectively. While the MOSFETs 5 and 16 are conducting, that is during the pulses of the signals H4T and H2T respectively, the voltages on the capacitances, represented by the capacitors 7 and 18, follow the voltage applied to the mode pin 1. When the pulses end, that is to say, at times in the cycle corresponding to the times B and A shown in FIG. 1, the capacitances remain charged to approximately the instantaneous level of the signal existing on the mode pin 1 at those times. The triggering effect of the feedback inverters 9 and 20 carries the voltages on the capacitors 7 and 18 either up to the supply voltage Vcc or down to ground, depending on whether the voltages are high or low, respectively, after being charged through the MOSFETs 5 and 16.

The MOSFETs 10 and 21, which are rendered conducting by the pulses of the signals H2T and H4T respectively, serve to charge the capacitances represented by the capacitors 12 and 23 respectively to the inverses of the voltages on the capacitors 7 and 18 during those pulses. As long as the signal applied to the mode pin 1 is the same as one of the four mode selection signals, the voltages on the capacitors 12 and 23 remain constant, in contrast to the voltages on the capacitors 7 and 18, which vary during the cycle when either LCLK 1 or LCLK 2 is applied to the mode pin 1. The feedback inverters 14 and 25 serve to shift and hold the voltages on the capacitors 12 and 23 to Vcc or ground by operating in the same manner as the inverters 9 and 20.

The output voltage of the inverter 13 remains high when Vcc or LCLK 1 is applied to the mode pin, and remains low when ground or LCLK 2 is applied to the mode pin. The output voltage of the inverter 24 remains high when Vcc or LCLK 2 is applied to the mode pin, and remains low when ground or LCLK 1 is applied to the mode pin. The NAND gates 27, 28, 29 and 30 respond to the different combinations of output voltages from the inverters 13 and 24 as described above.

FIGS. 3(a), 3(b), 3(c) and 3(d) show the four different connections to the mode pin from other pins of the integrated circuit which respectively cause the circuit to operate in the four different modes. All external components and connections other than the connection to the mode pin from the other pin are omitted from each of these figures for clarity of illustration, and it will be understood that the integrated circuit has many pins additional to those shown and also the circuit arrangement includes external components and connections which are not shown. Whilst the connection to the mode pin from one of the other pins may take the form of a direct connection as shown in the figures, it may alternatively be through a multi-position switch enabling the four modes to be selected by operation of the switch. Other ways of producing the required different connections selectively may be used.

In the example of the invention described above, two different clock signals LCLK 1 and LCLK 2 are output by the integrated circuit. In another example only one clock signal is output by the integrated circuit and the fourth different mode selection signal is provided by inverting the clock signal. The circuit described above with reference to FIG. 2 will also operate to discriminate between the clock signal output from the integrated circuit and its inverse, using the clock signal and its inverse in place of H2T and H4T. FIGS. 4(a), 4(b), 4(c) and 4(d) are simplified circuit diagrams corresponding to those shown in FIGS. 3(a), 3(b), 3(c) and 3(d) and which relate to this other example of the mode selection signals.

Where the integrated circuit has more than four modes of operation the modes can be selected by using two or more mode pins, each connected to a separate decoding circuit such as that shown in FIG. 2. Since each decoding circuit can select from among four modes, it follows that two such circuits can select from among 16 modes. Alternatively or additionally to the use of two or more mode pins, the decoding circuit or circuits may be made capable of discriminating between more than two phases of a clock signal and/or two or more frequencies of clock signal, the mode selection signals being supplemented by extra signals to make use of the enhanced discriminating ability of the decoding circuit or circuits.

Instead of the clock signal being generated in the integrated circuit, it may be generated by an external generator and applied to the integrated circuit through a clock signal input. The arrangement should be such that the two clock signals required by the decoding circuit are available in the integrated circuit. Otherwise, the circuitry and manner of operation are the same as those described above.

I claim:

1. An integrated circuit having at least two different modes of operation selected by a mode selection circuit in response to one or more inputs applied to one or more mode selection terminal pins, respectively, and one or more other terminal pins for one or more clock signals from a clock means, respectively, wherein at least one mode selection terminal pin is connected to a synchronous decoding circuit responsive to a clock signal related to that applied to the other terminal pin or one of the other terminal pins by the clock means and capable of producing a particular output only when another signal related to the clock signal applied to the said other terminal pin by the clock means is applied to the mode selection terminal pins, the mode selection circuit being responsive to the particular output of the synchronous decoding circuit.

2. A circuit according to claim 1, wherein the clock means is included in the circuit and the at least one other terminal pin conveys one or more signals from the clock means as an output from the circuit.

3. A circuit according to claim 1, arranged to receive the one or more signals from the clock means external to the circuit and which are applied to the circuit through the at least one or other terminal pin.

4. A circuit according to claim 1 wherein the synchronous decoding circuit includes two or more synchronous decoders respectively responsive to different phases and/or frequencies of clock signals from the clock means.

5. A circuit according to claim 1 in which the synchronous decoding circuit is also responsive to a steady high level signal and/or a steady low level signal applied to the mode selection pin to select further modes of operation of the circuit.

6. A circuit arrangement including an integrated circuit having at least two different modes of operation selected by a mode selection circuit in response to one or more inputs applied to one or more mode selection terminal pins respectively and one or more other terminal pins for receiving respective clock signals, clock means connected to apply clock signals to the one or more other terminal pins, and mode selecting means connected to the one or more mode selection terminal pins, wherein, in the integrated circuit, at least one mode selection terminal pin is connected to a synchronous decoding circuit responsive to the input or inputs received via the at least one mode selection terminal pin using as a reference at least one clock signal derived from those applied to the one or more other terminal pins, the mode selection circuit being responsive to one or more outputs from the synchronous decoding circuit, and the mode selecting means is capable of applying to the at least one mode selection terminal pin a clock signal derived from the clock means so as to cause the mode selection circuit to select a particular mode of operation of the integrated circuit.

7. A circuit arrangement according to claim 6, wherein the clock means is external to the integrated circuit.

8. A circuit arrangement according to claim 6, wherein the integrated circuit has four modes of operation and a single mode selection terminal pin, the four modes being obtained respectively when there is applied to the mode selection terminal pin a sustained high voltage level, a sustained low voltage level, a first phase of a signal derived from the clock means, and a second phase of the signal derived from the clock means.

* * * * *